(12) United States Patent
Happ et al.

(10) Patent No.: US 8,779,495 B2
(45) Date of Patent: Jul. 15, 2014

(54) STACKED SONOS MEMORY

(75) Inventors: Thomas Happ, Tarrytown, NY (US); Jan Boris Philipp, New York, MN (US)

(73) Assignee: Qimonda AG, Munich (DE)

( * ) Notice: Subject to any disclaimer, the term of this patent is extended or adjusted under 35 U.S.C. 154(b) by 1156 days.

(21) Appl. No.: 11/737,531

(22) Filed: Apr. 19, 2007

(65) Prior Publication Data

US 2008/0258203 A1 Oct. 23, 2008

(51) Int. Cl.
*H01L 29/76* (2006.01)

(52) U.S. Cl.
USPC .... 257/314; 257/324; 257/329; 257/E21.662; 257/E21.679

(58) Field of Classification Search
CPC ............ H01L 29/785; H01L 29/66795; H01L 27/115; H01L 29/792
USPC ........... 257/E21.662, E21.679, 314, 324, 329
See application file for complete search history.

(56) References Cited

U.S. PATENT DOCUMENTS

| | | | |
|---|---|---|---|
| 6,413,802 B1 | 7/2002 | Hu et al. | |
| 6,894,337 B1 | 5/2005 | Wang et al. | |
| 6,933,558 B2 | 8/2005 | Hill et al. | |
| 6,963,104 B2 | 11/2005 | Wu et al. | |
| 7,015,101 B2 | 3/2006 | Zheng et al. | |
| 7,098,477 B2 | 8/2006 | Zhu et al. | |
| 2004/0079988 A1* | 4/2004 | Harari | 257/316 |
| 2004/0206996 A1* | 10/2004 | Lee et al. | 257/296 |
| 2004/0219722 A1* | 11/2004 | Pham et al. | 438/157 |
| 2005/0139893 A1 | 6/2005 | Hofmann et al. | |
| 2005/0189583 A1* | 9/2005 | Kim et al. | 257/327 |
| 2005/0199913 A1* | 9/2005 | Hofmann et al. | 257/204 |
| 2005/0227424 A1* | 10/2005 | Oh et al. | 438/197 |
| 2005/0242391 A1 | 11/2005 | She et al. | |
| 2005/0258477 A1* | 11/2005 | Saito | 257/327 |
| 2006/0027870 A1* | 2/2006 | Inaba | 257/353 |
| 2006/0180866 A1* | 8/2006 | Zhu et al. | 257/368 |
| 2006/0189058 A1* | 8/2006 | Lee et al. | 438/198 |
| 2006/0234456 A1* | 10/2006 | Anderson et al. | 438/284 |
| 2006/0249779 A1* | 11/2006 | Choi et al. | 257/315 |
| 2007/0018201 A1* | 1/2007 | Specht et al. | 257/204 |
| 2007/0063263 A1* | 3/2007 | Oh et al. | 257/316 |

OTHER PUBLICATIONS

S. Kim, et al., "Paired FinFET Charge Trap Flash Memory for Vertical High Density Storage", VLSI 2006.
E.K. Lai, et al., "A Highly Stackable Thin Film Transistor (TFT) NAND-type Flash Memory", VLSI 2006.

* cited by examiner

*Primary Examiner* — Anthony Ho
*Assistant Examiner* — David Chen
(74) *Attorney, Agent, or Firm* — John S. Economou

(57) ABSTRACT

An integrated circuit includes a first SONOS memory cell and a second SONOS memory cell. The second memory cell is stacked on the first memory cell.

15 Claims, 18 Drawing Sheets

STACKED SONOS MEMORY

BACKGROUND

Flash memory is one type of non-volatile memory that can be electrically erased and reprogrammed. Flash memory is erased and programmed in blocks where each block includes multiple memory cells. Each memory cell includes a floating gate transistor for storing information. Each floating gate transistor stores one or more bits of data. One type of flash memory is NAND flash. NAND flash uses tunnel injection for writing data to a memory cell and tunnel release for erasing data from a memory cell. NAND flash memories are accessed as block devices. The blocks are typically 512, 2048, or other suitable number of bits in length.

Another type of non-volatile memory is charge trapping memory, specifically semiconductor-oxide-nitride-oxide-semiconductor (SONOS) memory. A SONOS memory cell typically includes a standard metal-oxide-semiconductor (MOS) transistor with a charge trapping dielectric. The charge trapping dielectric is where the data bit or bits are stored. The charge trapping dielectric typically includes a multilayer structure including a first oxide layer, a nitride layer, and a second oxide layer. With the gate biased positively, electrons from the emitter-collector circuit tunnel through the first oxide layer and get trapped in the nitride layer. The trapped electrons provide an energy barrier between the emitter and the collector that raises the threshold voltage (Vt) of the transistor, which is used to store bits of data. The electrons are removed by applying a negative bias on the gate.

After programming a memory cell, the state of the memory cell can be sensed by applying a small gate voltage to the storage transistor to be read. The voltage is selected to be between the threshold voltages expected for the states to be sensed. If current flows between the collector and the emitter, the memory cell is in the no trapped electron state, and is therefore set to a logic "0" state. If no current flows between the collector and the emitter, the memory cell has trapped electrons and is therefore set to a logic "1" state. Similarly, several different Vt states can be used to store multiple bits of data.

One type of transistor is a finFET transistor. A finFET transistor is a metal-oxide-semiconductor field effect transistor (MOSFET) multi-gate transistor. A finFET transistor is typically fabricated on a silicon on insulator (SOI) substrate. The gate of the transistor is placed on at least two sides of the channel of the transistor to form a multi-gate structure and hence provides improved channel control.

To increase the storage density of the NAND flash, the minimum feature size (F) is reduced. To reduce the minimum feature size requires increasingly expensive lithography and processing tools to perform complex processing. In addition, the intrinsic scaling of the transistors as well as the capacitive coupling of the floating gates is reaching physical limitations.

For these and other reasons, there is a need for the present invention.

SUMMARY

One embodiment provides an integrated circuit. The integrated circuit includes a first SONOS memory cell and a second SONOS memory cell. The second memory cell is stacked on the first memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
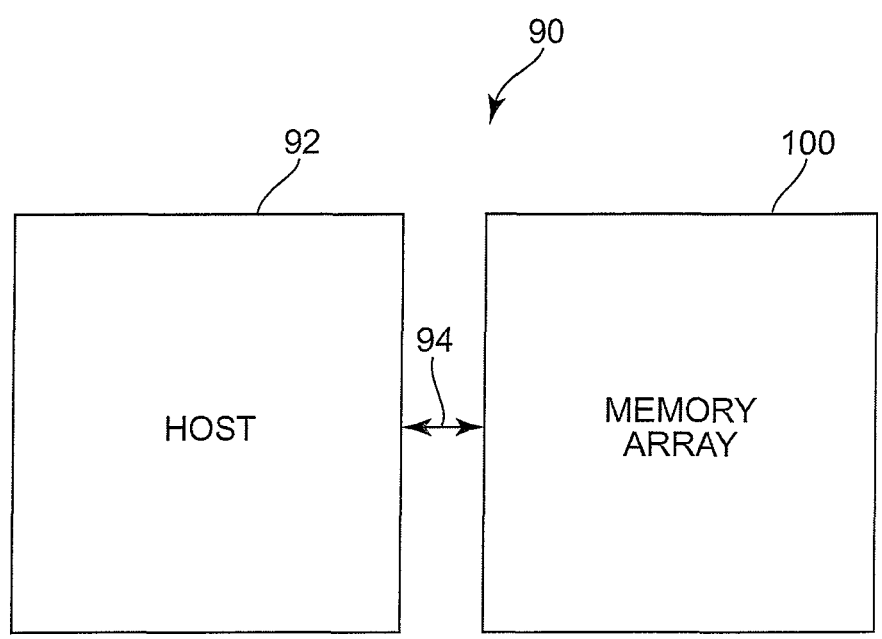
FIG. 1A is a block diagram illustrating one embodiment of a system.

FIG. 1A is a block diagram illustrating one embodiment of a system 90. System 90 includes a host 92 and a memory array 100. Host 92 is communicatively coupled to memory array 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory array 100 provides memory for host 92. In one embodiment, memory array 100 includes a stacked semiconductor-oxide-nitride-oxide-semiconductor (SONOS) memory.

Figure 1B:
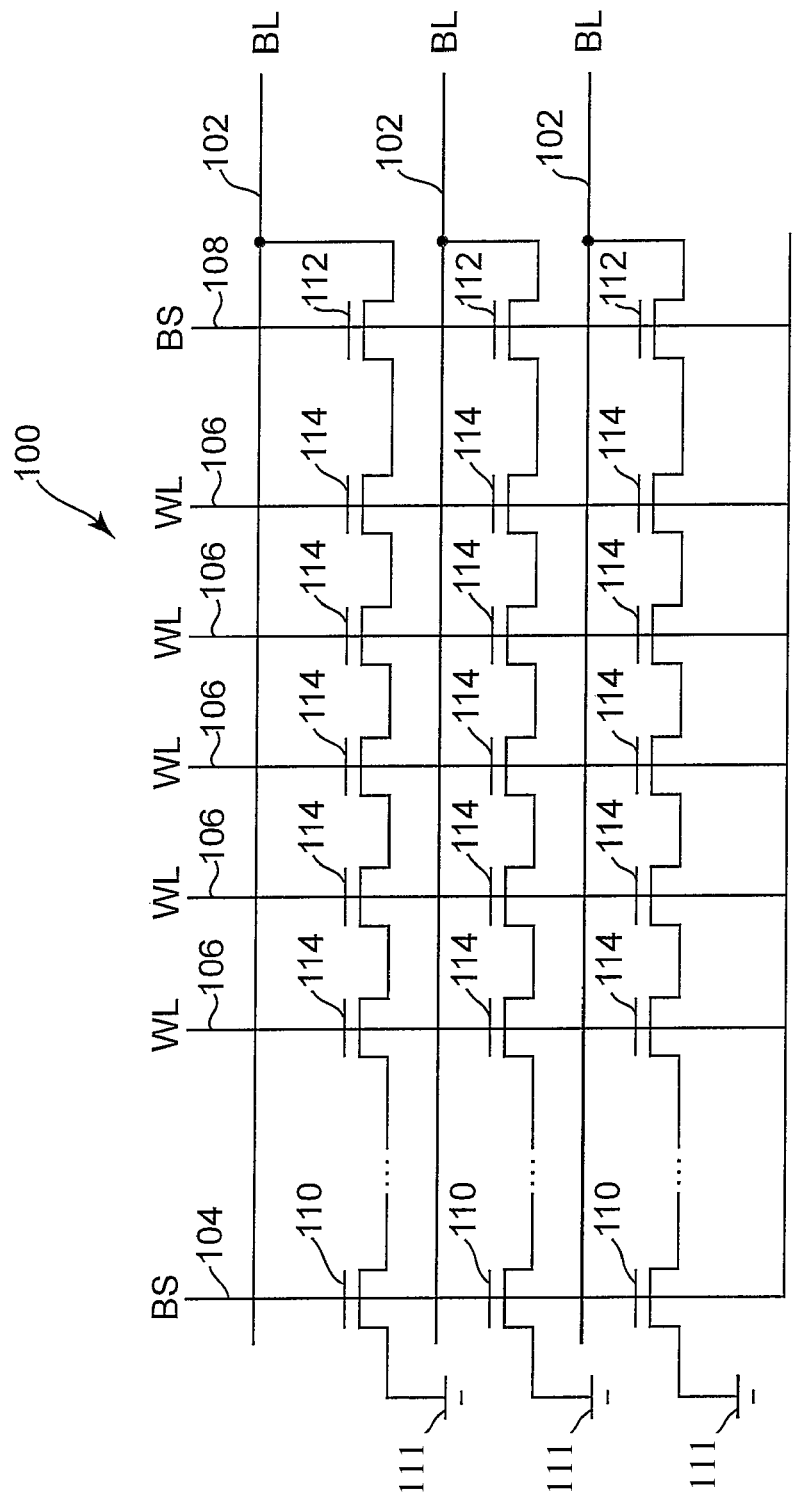
FIG. 1B is a schematic diagram illustrating one embodiment of an array of memory cells.

FIG. 1B is a schematic diagram illustrating one embodiment of an array of memory cells 100. Array of memory cells 100 includes a first bit line select line 104, first bit line select transistors 110, a second bit line select line 108, second bit line select transistors 112, bit lines 102, word lines 106, and memory cells 114. Each memory cell 114 is an upper or lower finFET semiconductor-oxide-nitride-oxide-semiconductor (SONOS) memory cell in a stack of at least two finFET SONOS memory cells. A first chain of finFET SONOS memory cells 114 coupled to a first bit line 102 are stacked on top of a second chain of finFET SONOS memory cells 114 coupled to a second bit line 102. The first and second stacked chains of finFET SONOS memory cells 114 share common word lines 106.

As used herein, the term "SONOS" is used generically and includes any suitable materials arranged in a similar manner to provide a similar function and is not limited to semiconductor-oxide-nitride-oxide-semiconductor materials. For example, "SONOS" may include a semiconductor-high k dielectric-nitride-high k dielectric-metal materials.

As used herein, the term "electrically coupled" is not meant to mean that the elements must be directly coupled together and intervening elements may be provided between the "electrically coupled" elements.

The gate of each first bit line select transistor 110 receives a bit line select signal on first bit line select line 104. One side of the source/drain path of each first bit line select transistor 110 is electrically coupled to a common or ground 111. The other side of the source/drain path of each first bit line select transistor 110 is electrically coupled to one side of the source/drain path of a first finFET SONOS memory cell 114 in a chain of finFET SONOS memory cells 114. The source/drain path of each finFET SONOS memory cell 114 in each chain is electrically coupled to the source/drain path of another finFET SONOS memory cell 114 in the chain. The gate of each finFET SONOS transistor 114 receives a word line select signal on a word line 106. The source/drain path of the last finFET SONOS memory cell 114 in each chain is electrically coupled to the source/drain path of a second bit line select transistor 112. The other side of the source/drain path of each second bit line select transistor 112 is electrically coupled to a bit line 102. The gate of each second bit line select transistor 112 receives a bit line select signal on second bit line select line 108.

Memory array 100 provides a NAND finFET SONOS memory array. To access a finFET SONOS memory cell 114 for read or write access, the bit line 102 for the selected finFET SONOS memory cell 114 is selected by activating the respective first and second bit line select transistors 110 and 112. During a read operation, all the word lines 106 except for the word line 106 for the selected finFET SONOS memory cell 114 are activated to place the unselected finFET SONOS memory cells 114 into a pass mode. The word line 106 for the selected finFET SONOS memory cell 114 is activated to read the data value stored in the selected finFET SONOS memory cell 114. The data signal passes to the selected bit line through the unselected finFET SONOS memory cells 114 in the chain between the selected finFET SONOS memory cell 114 and the selected bit line 102. During a write operation, all the word lines 106 are activated to erase the data stored in each finFET SONOS memory cell 114 along a selected chain of memory cells 114. Selected finFET SONOS memory cells 114 are then biased to write at least one data bit to the selected finFET SONOS memory cells 114.

Figure 2:
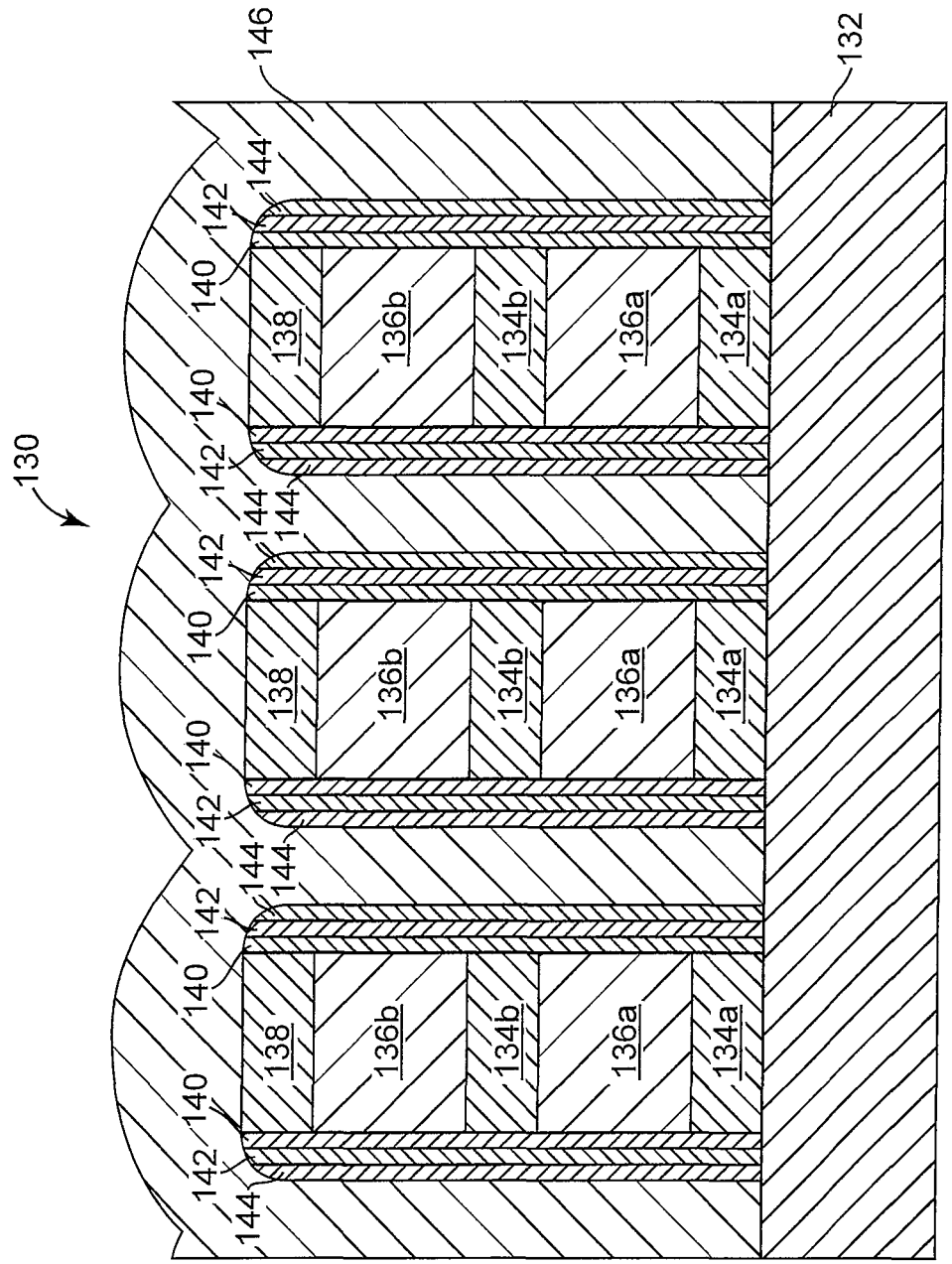
FIG. 2 illustrates a cross-sectional view of one embodiment of a stacked finFET semiconductor-oxide-nitride-oxide-semiconductor (SONOS) memory.

FIG. 2 illustrates a cross-sectional view of one embodiment of a stacked finFET SONOS memory 130. Stacked finFET SONOS memory 130 includes substrate 132, first oxide layers 134a, first bit lines 136a, second oxide layers 134b, second bit lines 136b, hard mask material layers 138, tunnel dielectric material layers 140, trapping material layers 142, blocking dielectric material layers 144, and word lines 146. Substrate 132 contacts first oxide layers 134a. First oxide layers 134a contact first bit lines 136a. First bit lines 136a contact second oxide layers 134b. Second oxide layers 134b contact second bit lines 136b. Second bit lines 136b contact hard mask material layers 138. The sidewalls of first oxide layers 134a, first bit lines 136a, second oxide layers 134b, second bit lines 136b, and hard mask material layers 138 contact tunnel dielectric material layers 140. Tunnel dielectric material layers 140 contact trapping material layers 142. Trapping material layers 142 contact blocking dielectric material layers 144. Blocking dielectric material layers 144 contact word lines 146.

In one embodiment, substrate 132 includes bulk silicon or other suitable substrate material. First oxide layers 134a and second oxide layers 134b include $SiO_2$ or other suitable dielectric material. First oxide layers 134a isolate the lower finFET SONOS memory cells 114 in each stack of memory cells from substrate 132. Second oxide layers 134b isolate the lower finFET SONOS memory cells 114 from the upper finFET SONOS memory cells 114 in each stack of memory cells.

Hard mask material layers 138 include SiN or other suitable hard mask material. Hard mask material layers 138 are used to define first oxide layers 134a, first bit lines 136a, second oxide layers 134b, and second bit lines 136b. Hard mask material layers 138 also isolate second bits lines 136b from word lines 146.

In one embodiment, first bit lines 136a and second bit lines 136b include silicon regions and doped silicon regions. The doped silicon regions provide source/drain regions for finFET SONOS memory cells 114. Each source/drain region is shared by two adjacent finFET SONOS memory cells 114 in a chain. The undoped silicon regions provide channel regions for finFET SONOS memory cells 114.

In one embodiment, tunnel dielectric material layers 140 include an oxide (e.g., $SiO_2$) or other suitable tunnel dielectric material. Trapping material layers 142 include a nitride (e.g., SiN) or other suitable trapping material. Blocking dielectric material layers 144 include an oxide (e.g., $SiO_2$) or other suitable blocking dielectric material. Trapping material layer 142 stores one or more data bits for each finFET SONOS memory cell 114. Each word line 146 includes a polysilicon, metal, or other suitable material and forms a gate for each finFET SONOS memory cell 114.

Stacked finFET SONOS memory 130 includes chains of finFET SONOS memory cells 114. A lower chain of finFET SONOS memory cells 114 is formed along each first bit line 136a and an upper chain of finFET SONOS memory cells 114 is formed along each second bit line 136b. By stacking two or more finFET SONOS memory cells 114, an efficient increase in storage density at more relaxed critical dimensions is provided compared to typical flash memory devices.

The following FIGS. 3-7 illustrate one embodiment for fabricating stacked finFET SONOS memory 130 previously described and illustrated with reference to FIG. 2.

Figure 3:
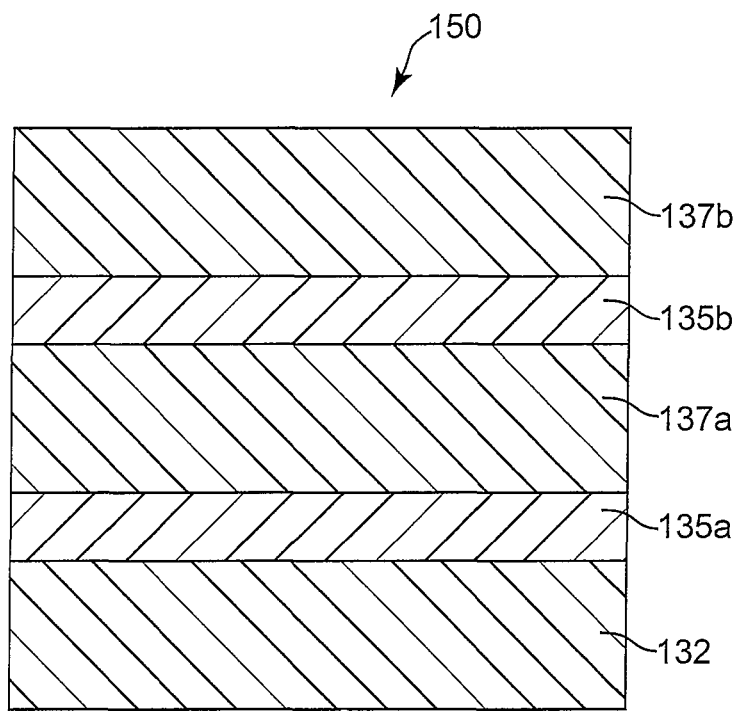
FIG. 3 illustrates a cross-sectional view of one embodiment of a double silicon on insulator (SOI) wafer.

FIG. 3 illustrates a cross-sectional view of one embodiment of a double silicon on insulator (SOI) wafer 150. Double SOI wafer 150 includes a bulk silicon layer 132, a first buried oxide (BOX) layer 135a, a first silicon layer 137a, a second BOX layer 135b, and a second silicon layer 137b. In one embodiment, double SOI wafer 150 is fabricated by wafer fusion. In other embodiments, double SOI wafer 150 is fabricated using other suitable techniques.

Figure 4:
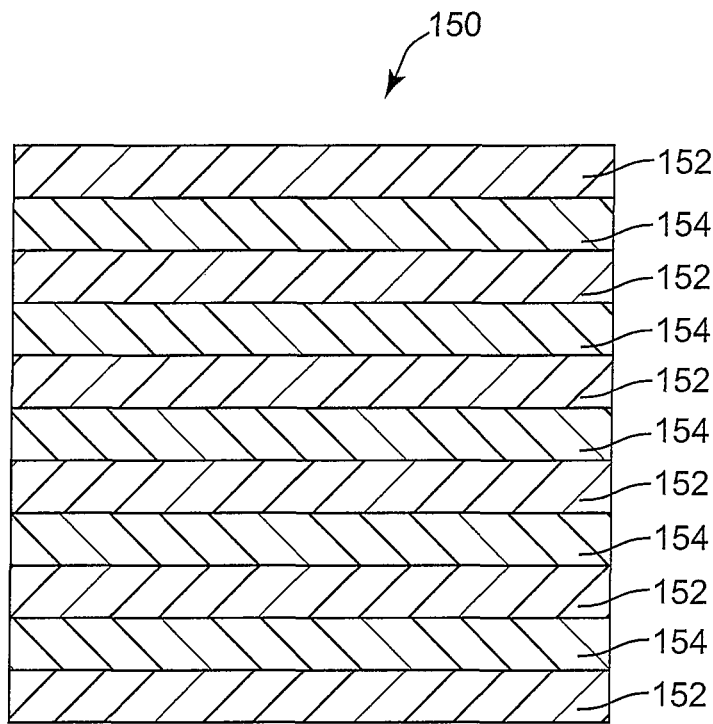
FIG. 4 is a top view illustrating one embodiment of the wafer after defining source/drain regions in the wafer and implanting source/drain dopants in the wafer.

FIG. 4 is a top view illustrating one embodiment of wafer 150 after defining source/drain regions 154 in wafer 150 and implanting source/drain dopants in wafer 150. Line lithography is used to define lines 152, which include a protection material, such as photoresist, on the top of wafer 150. Lines 154 define where the top of wafer 150 is exposed. Source/drain dopants are implanted into exposed portions 154 of wafer 150. The source/drain dopants are implanted at different energy levels into first silicon layer 137a and second silicon layer 137b to achieve uniform lower and upper finFET SONOS memory cell 114 performance.

Figure 5A:
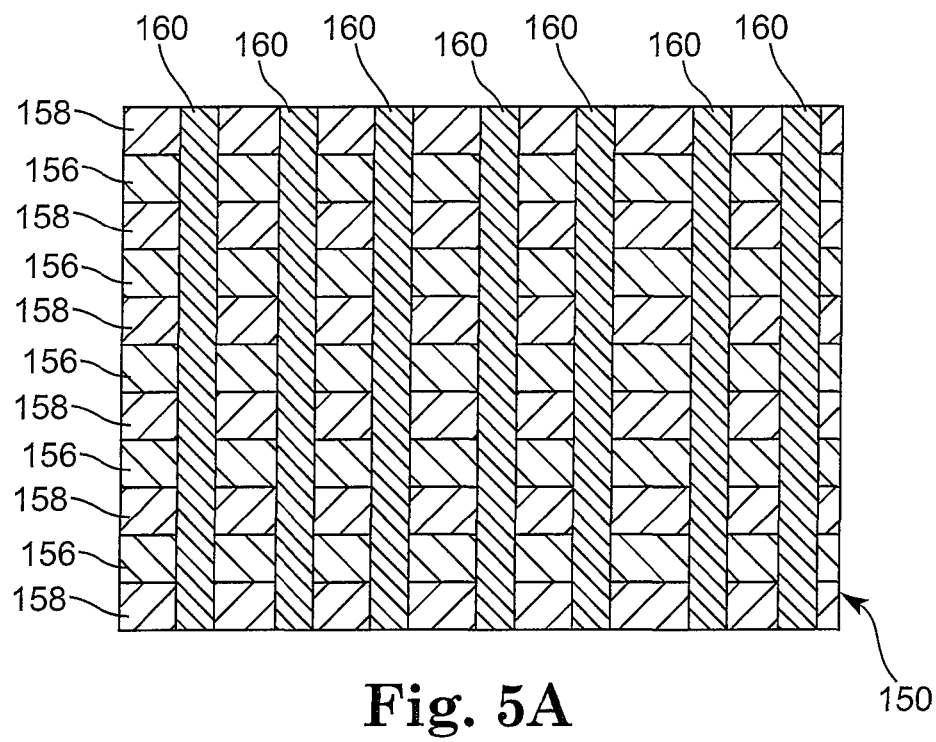
FIG. 5A is a top view illustrating one embodiment of the wafer after etching the wafer.

FIG. 5A is a top view illustrating one embodiment of wafer 150 after etching wafer 150. The protection material of lines 152 is removed. A hard mask material, such as SiN or other suitable hard mask material is then deposited over wafer 150 to provide a hard mask material layer. The hard mask material layer is deposited using chemical vapor deposition (CVD), atomic layer deposition (ALD), metal organic chemical vapor deposition (MOCVD), plasma vapor deposition (PVD), jet vapor deposition (JVD), or other suitable deposition technique.

Line lithography is used to define lines 160 perpendicular to lines 154. Lines 160 expose portions of the hard mask material layer. The exposed portions of the hard mask material layer and the portions of second silicon layer 137b, second BOX layer 135b, first silicon layer 137a, and first BOX layer 135a underlying the exposed portions of the hard mask material layer are etched. After etching, the portions of second silicon layer 137b, second BOX layer 135b, first silicon layer 137a, and first BOX layer 135a underlying the protected portions of the hard mask material layer provide source/drain regions as indicated at 156 and channel regions as indicated at 158.

Figure 5B:
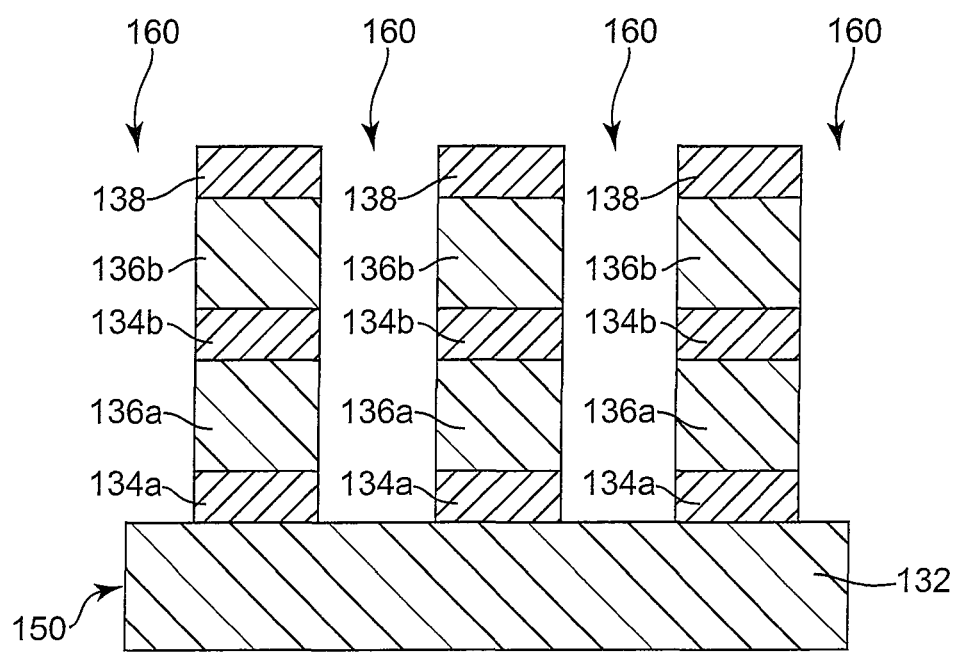
FIG. 5B illustrates a cross-sectional view of one embodiment of the wafer after etching the wafer.

FIG. 5B illustrates a cross-sectional view of one embodiment of wafer 150 after etching wafer 150. The exposed portions of the hard mask material layer and the portions of second silicon layer 137b, second BOX layer 135b, first silicon layer 137a, and first BOX layer 135a underlying the exposed portions of the hard mask material layer are etched to provide openings 160, which divide wafer 150 into chains of upper and lower locations for finFET SONOS memory cells 114. The hard mask material layer and wafer 150 are etched to provide hard mask material layers 138, second bit lines 136b, second oxide layers 134b, first bit lines 136a, and first oxide layers 134a as previously described and illustrated with reference to FIG. 2.

Figure 6:
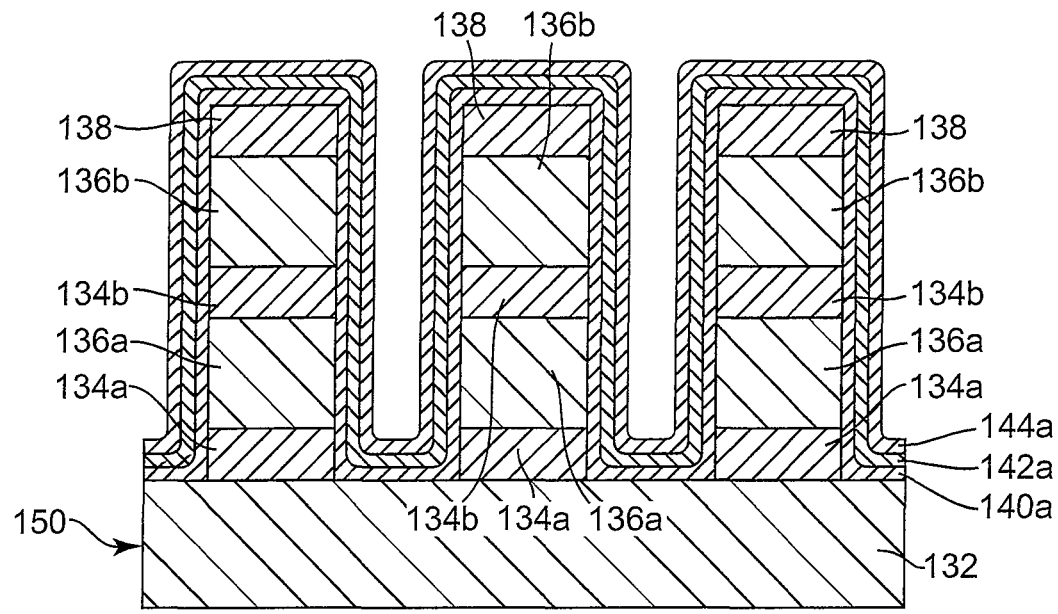
FIG. 6 illustrates a cross-sectional view of one embodiment of the etched wafer, a tunnel dielectric material layer, a trapping material layer, and a blocking dielectric material layer.

FIG. 6 illustrates a cross-sectional view of etched wafer 150, a tunnel dielectric material layer 140a, a trapping material layer 142a, and a blocking dielectric material layer 144a.

A tunnel dielectric material, such as an oxide (e.g., SiO$_2$, HfO) or other suitable tunnel dielectric material is grown or conformally deposited over exposed portions of substrate 132, first oxide layers 134a, first bit lines 136a, second oxide layers 134b, second bit lines 136b, and hard mask material layers 138 to provide tunnel dielectric material layer 140a. Tunnel dielectric material layer 140a is deposited using CVD, ALD, MOCVD, PVD, JVD, or other suitable deposition technique.

A trapping material, such as a nitride (e.g., SiN), oxide (e.g. Al$_2$O$_3$), or other suitable trapping material is conformally deposited over tunneling dielectric material layer 140a to provide trapping material layer 142a. Trapping material layer 142a is deposited using CVD, ALD, MOCVD, PVD, JVD, or other suitable deposition technique.

A blocking dielectric material, such as an oxide (e.g., SiO$_2$, HfO) or other suitable blocking dielectric material is deposited over trapping layer 142a to provide blocking dielectric material layer 144a. Blocking dielectric material layer 144a is deposited using CVD, ALD, MOCVD, PVD, JVD, or other suitable deposition technique.

Figure 7:
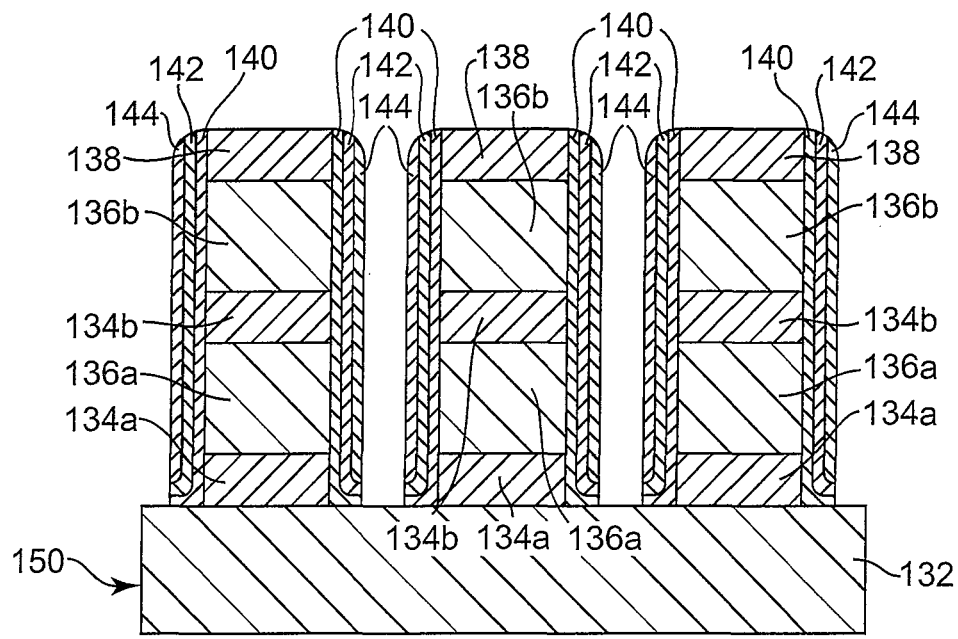
FIG. 7 illustrates a cross-sectional view of one embodiment of the etched wafer, tunnel dielectric material layers, trapping material layers, and blocking dielectric material layers after etching the tunnel dielectric material layer, the trapping material layer, and the blocking dielectric material layer.

FIG. 7 illustrates a cross-sectional view of one embodiment of etched wafer 150, tunnel dielectric material layers 140, trapping material layers 142, and blocking dielectric material layers 144 after etching tunnel dielectric material layer 140a, trapping material layer 142a, and blocking dielectric material layer 144a. Blocking dielectric material layer 144a, trapping material layer 142a, and tunnel dielectric material layer 140a are etched to expose hard mask 138 and substrate 132 to provide tunnel dielectric material layers 140, trapping material layers 142, and blocking dielectric material layers 144 as previously described and illustrated with reference to FIG. 2.

A word line and gate material, such as polysilicon, metal, or other suitable word line and gate material, is deposited over exposed portions of hard mask material layers 138, blocking dielectric material layers 144, trapping material layers 142, tunnel dielectric material layers 140, and substrate 132. The word line and gate material is patterned and etched to provide word lines 146 and finFET SONOS memory 130 as previously described and illustrated with reference to FIG. 2.

The following FIGS. 8-17 illustrate another embodiment for fabricating stacked finFET SONOS memory 130 previously described and illustrated with reference to FIG. 2.

Figure 8:
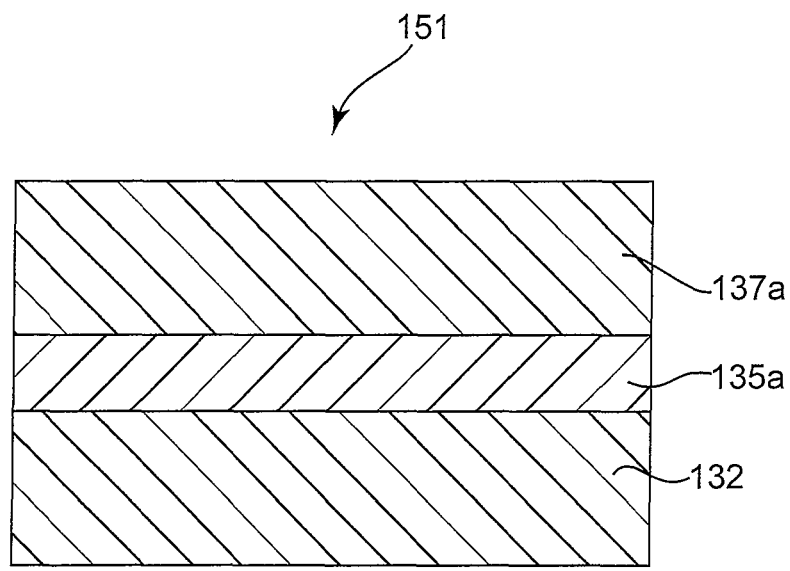
FIG. 8 illustrates a cross-sectional view of one embodiment of a SOI wafer.

FIG. 8 illustrates a cross-sectional view of one embodiment of a SOI wafer 151. SOI wafer 151 includes a bulk silicon layer 132, a first BOX layer 135a, and a first silicon layer 137a. Source/drain regions are formed in first silicon layer 137a of wafer 151 similarly to the source/drain regions formed in wafer 150 previously described and illustrated with reference to FIG. 4. A hard mask material layer is deposited over wafer 151 and patterned similarly to the patterned hard mask material layer on wafer 150 previously described and illustrated with reference to FIG. 5A.

Figure 9:
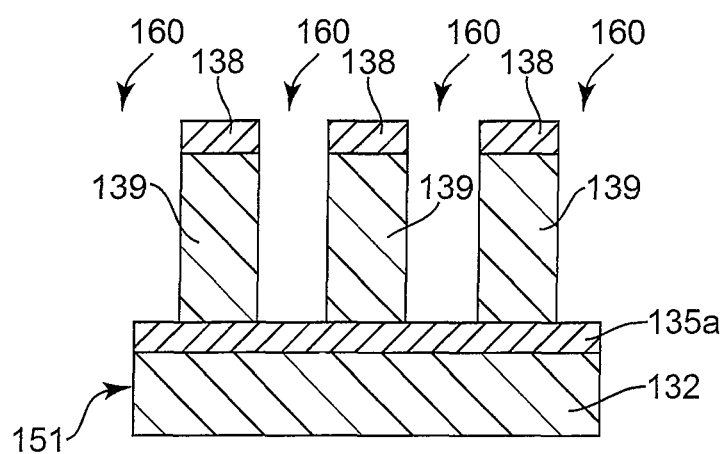
FIG. 9 illustrates a cross-sectional view of one embodiment of the wafer after etching the wafer.

FIG. 9 illustrates a cross-sectional view of one embodiment of wafer 151 after etching wafer 151. The exposed portions of the hard mask material layer and the portions of first silicon layer 137a underlying the exposed portions of the hard mask material layer are etched to provide openings 160, which divide wafer 151 into chains of locations for finFET SONOS memory cells 114. Wafer 151 is etched to provide hard mask material layers 138 and silicon portions 139.

Figure 10:
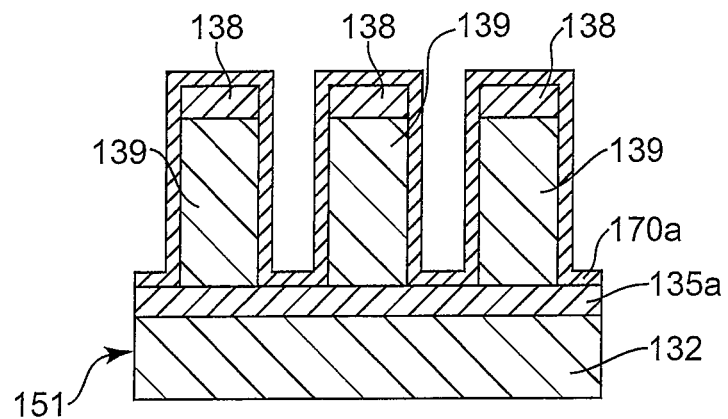
FIG. 10 illustrates a cross-sectional view of one embodiment of the etched wafer and a first protection material layer.

FIG. 10 illustrates a cross-sectional view of one embodiment of etched wafer 151 and a first protection material layer 170a. A protection material, such as SiN or other suitable protection material is conformally deposited over exposed portions of hard mask material layers 138, silicon portions 139, and first oxide layer 135a to provide first protection material layer 170a. Protection material layer 170a is deposited using CVD, ALD, MOCVD, PVD, JVD, or other suitable deposition technique.

Figure 11:
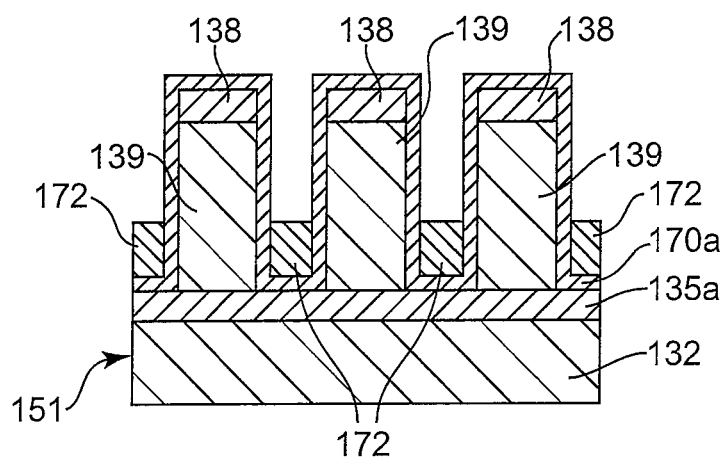
FIG. 11 illustrates a cross-sectional view of one embodiment of the etched wafer, the first protection material layer, and a first spacer material layer.

FIG. 11 illustrates a cross-sectional view of one embodiment of etched wafer 151, first protection material layer 170a, and a first spacer material layer 172. Spacer material, such as an oxide (e.g., SiO$_2$) or other suitable spacer material is deposited over protection material layer 170a. The spacer material is deposited using CVD, ALD, MOCVD, PVD, JVD, or other suitable deposition technique. The spacer material is recessed etched to provide spacer material layer 172.

Figure 12:
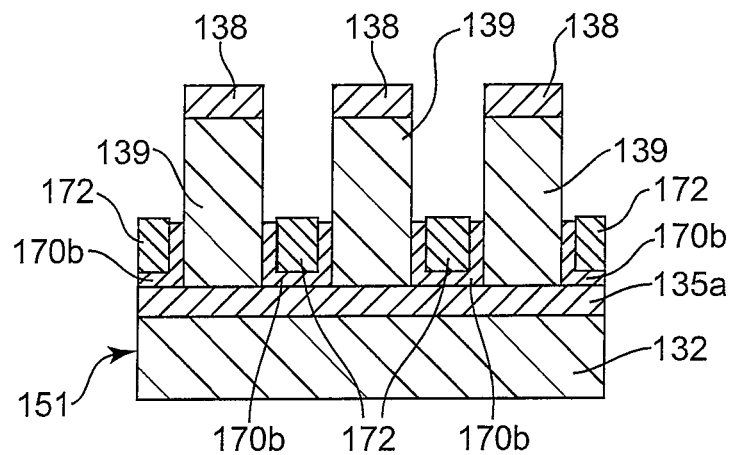
FIG. 12 illustrates a cross-sectional view of one embodiment of the etched wafer, the first protection material layer, and the first spacer material layer after etching the first protection material layer.

FIG. 12 illustrates a cross-sectional view of one embodiment of etched wafer 151, first protection material layer 170b, and spacer material layer 172 after etching first protection material layer 170a. First protection material layer 170a is etched using a wet etch, isotropic dry etch, or other suitable etch to provide first protection material layer 170b. The exposed top portion of first protection material layer 170b defines the height of first bit lines 136a, which are formed in later processing steps.

Figure 13:
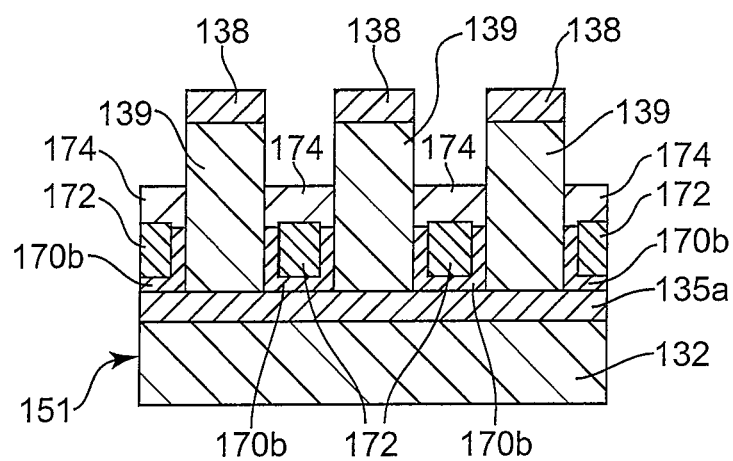
FIG. 13 illustrates a cross-sectional view of one embodiment of the etched wafer, the first protection material layer, the first spacer material layer, and a second spacer material layer.

FIG. 13 illustrates a cross-sectional view of one embodiment of etched wafer 151, first protection material layer 170b, first spacer material layer 172, and a second spacer material layer 174. Spacer material, such as an oxide (e.g., SiO$_2$) or other suitable spacer material is deposited over exposed portions of hard mask material layers 138, silicon portions 139, first spacer material layer 172, and first protection material layer 170b. The second spacer material is deposited using CVD, ALD, MOCVD, PVD, JVD, or other suitable deposition technique. The second spacer material is recessed etched to provide spacer material layer 174. The height of spacer material layer 174 defines the height of second oxide layers 134b, which are formed in later processing steps.

Figure 14:
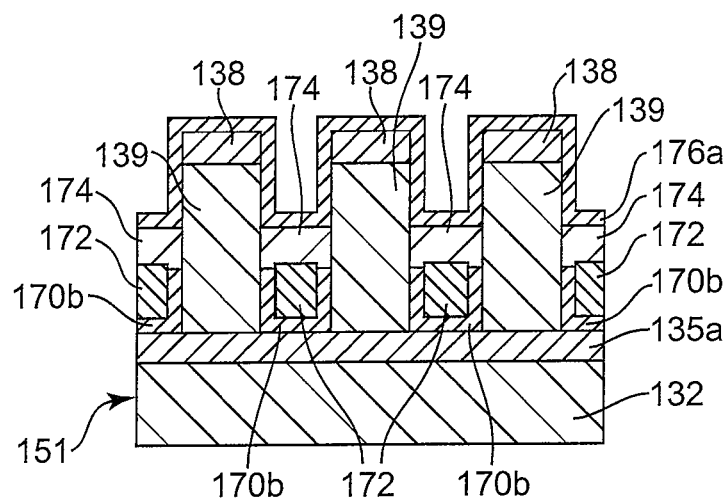
FIG. 14 illustrates a cross-sectional view of one embodiment of the etched wafer, the first protection material layer, the first and second spacer material layers, and a second protection material layer.

FIG. 14 illustrates a cross-sectional view of one embodiment of etched wafer 151, first protection material layer 170b, first and second spacer material layers 172 and 174, and a second protection material layer 176a. A protection material, such as SiN or other suitable protection material is conformally deposited over exposed portions of hard mask material layers 138, silicon portions 139, and second spacer material layer 174 to provide second protection material layer 176a. Second protection material layer 176a is deposited using CVD, ALD, MOCVD, PVD, JVD, or other suitable deposition technique.

Figure 15:
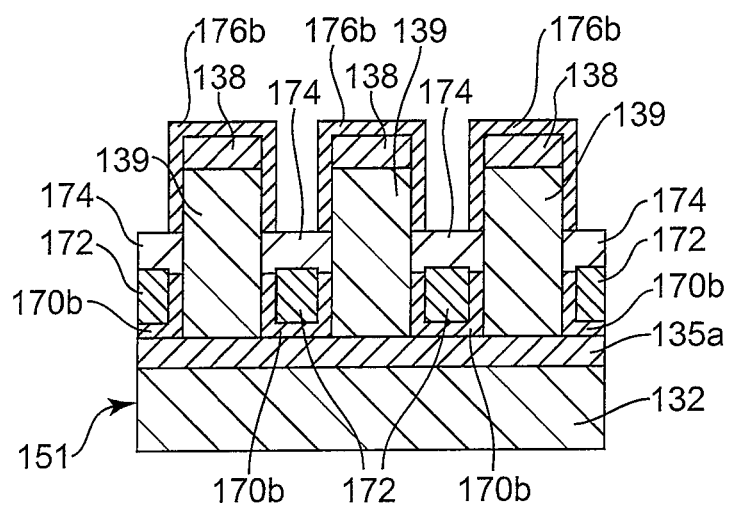
FIG. 15 illustrates a cross-sectional view of one embodiment of the etched wafer, the first protection material layer, the first and second spacer material layers, and the second protection material layer after etching the second protection material layer.

FIG. 15 illustrates a cross-sectional view of one embodiment of etched wafer 151, first protection material layer 170b, first and second spacer material layers 172 and 174, and second protection material layer 176b after etching second protection material layer 176a. Second protection material layer 176a is etched to expose second spacer material layer 174. In one embodiment, a dry back etch or other suitable etch is used to expose second spacer material layer 174.

Figure 16:
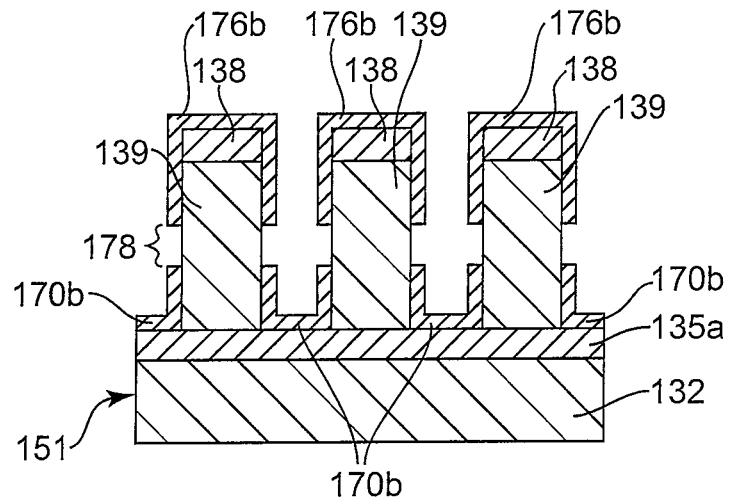
FIG. 16 illustrates a cross-sectional view of one embodiment of the etched wafer and the first and second protection material layers after etching the first and second spacer material layers.

FIG. 16 illustrates a cross-sectional view of etched wafer 151 and first and second protection material layers 170b and 176b after etching first and second spacer material layers 172 and 174. First and second spacer material layers 172 and 174 are removed to expose portions 178 of silicon portions 139. Exposed portions 178 define the location of second oxide layers 134b, which are formed in later processing steps.

Figure 17:
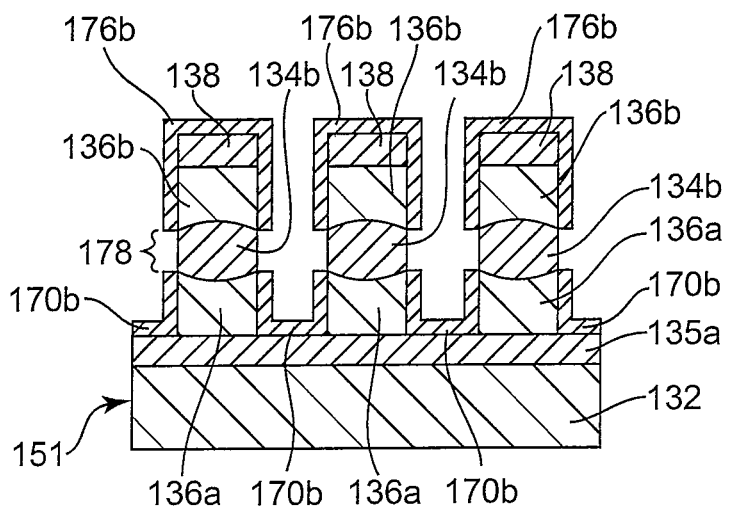
FIG. 17 illustrates a cross-sectional view of one embodiment of the etched wafer and the first and second protection material layers after oxidizing the exposed portions of the etched wafer.

FIG. 17 illustrates a cross-sectional view of one embodiment of etched wafer 151 and first and second protection material layers 170b and 176b after oxidizing exposed portions 178 of silicon portions 139. Exposed portions 178 of silicon portions 139 are oxidized to provide first bit lines 136a, second oxide layers 134b, and second bit lines 136b as previously described and illustrated with reference to FIG. 2.

First and second protection material layers 170b and 176b are then removed and the fabrication process continues as previously described and illustrated beginning at FIG. 6.

The following FIGS. 18-22 illustrate another embodiment for fabricating stacked finFET SONOS memory 130 previously described and illustrated with reference to FIG. 2.

Figure 18:
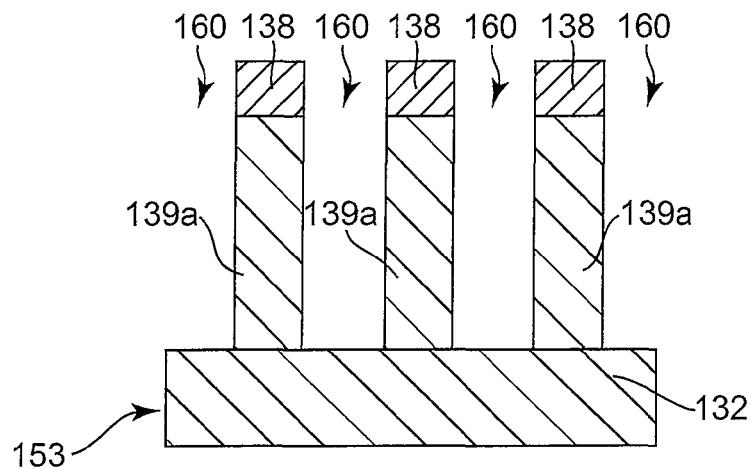
FIG. 18 illustrates a cross-sectional view of one embodiment of the wafer after etching the wafer.

FIG. 18 illustrates a cross-sectional view of one embodiment of wafer 153 after etching a wafer 153. In this embodiment, a bulk silicon wafer 153 is used to fabricate stacked finFET SONOS memory 130. Source/drain regions are formed in the bulk silicon of wafer 153 similarly to the source/drain regions formed in wafer 150 previously described and illustrated with reference to FIG. 4. A hard mask material layer is deposited over wafer 153 and patterned similarly to the patterned hard mask material layer on wafer 150 previously described and illustrated with reference to FIG. 5A.

The exposed portions of the hard mask material layer and portions of the bulk silicon underlying the exposed portions of the hard mask material layer are etched to provide openings 160, which divide wafer 153 into chains of locations for finFET SONOS memory cells 114. Wafer 153 is etched to provide hard mask material layers 138 and silicon portions 139a while leaving substrate 132.

Figure 19:
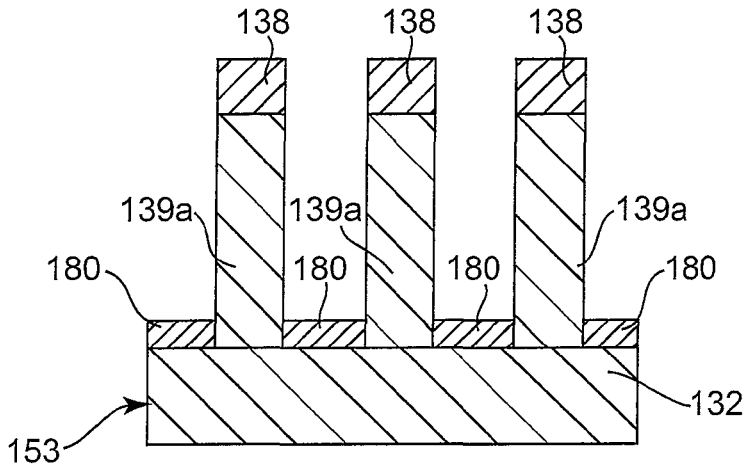
FIG. 19 illustrates a cross-sectional view of one embodiment of the etched wafer and a first spacer material layer.

FIG. 19 illustrates a cross-sectional view of one embodiment of etched wafer 153 and a first spacer material layer 180. Spacer material, such as an oxide (e.g., $SiO_2$) or other suitable spacer material is deposited over exposed portions of hard mask material layers 138, silicon portions 139a, and substrate 132. The spacer material is deposited using CVD, ALD, MOCVD, PVD, JVD, or other suitable deposition technique. The spacer material is etched using a recess etch, back etch, or other suitable etch to provide spacer material layer 180.

Figure 20:
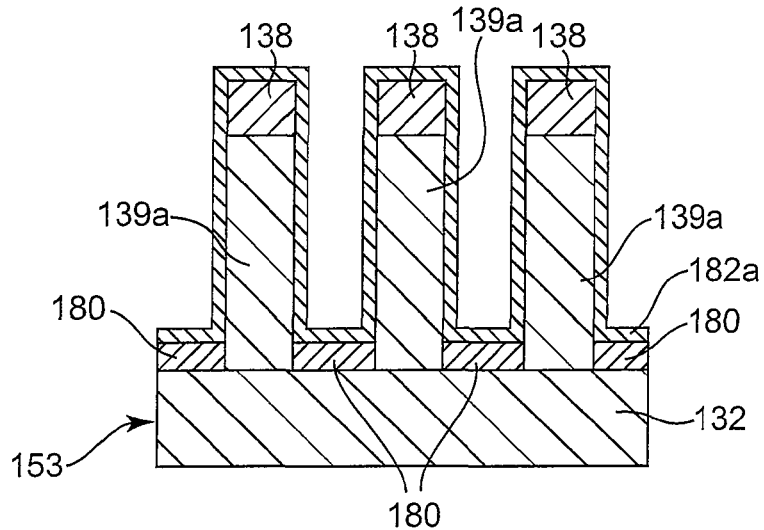
FIG. 20 illustrates a cross-sectional view of one embodiment of the etched wafer, the first spacer material layer, and a first protection material layer.

FIG. 20 illustrates a cross-sectional view of one embodiment of etched wafer 153, first spacer material layer 180, and a first protection material layer 182a. A protection material, such as SiN or other suitable protection material is conformally deposited over exposed portions of hard mask material layers 138, silicon portions 139a, and first spacer material layer 180 to provide first protection material layer 182a. First protection material layer 182a is deposited using CVD, ALD, MOCVD, PVD, JVD, or other suitable deposition technique.

Figure 21:
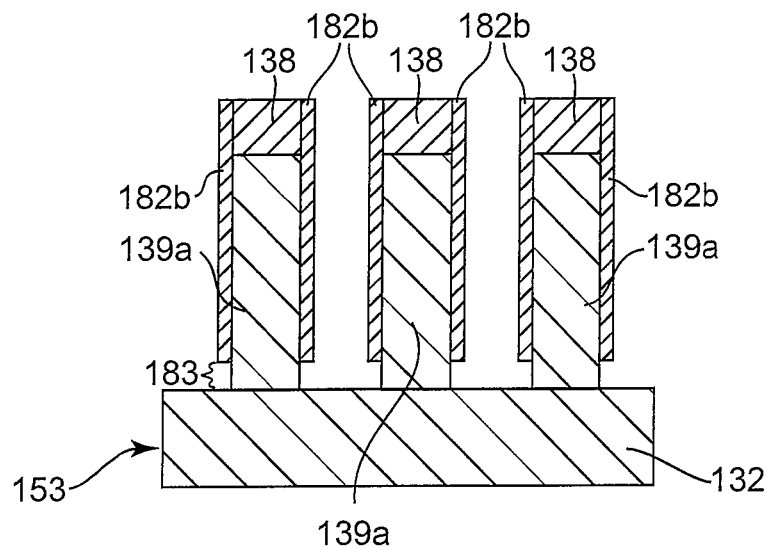
FIG. 21 illustrates a cross-sectional view of one embodiment of the etched wafer and the first protection material layer after etching the first protection material layer and the first spacer material layer.

FIG. 21 illustrates a cross-sectional view of one embodiment of etched wafer 153 and first protection material layer 182b after etching first protection material layer 182a and first spacer material layer 180. First protection material layer 182a is etched using a spacer reactive ion etch or other suitable etch to expose hard mask material layers 138 and first spacer material layer 180. First spacer material layer 180 is removed using a wet etch or other suitable etch to expose portions 183 of silicon portions 139a and substrate 132.

Figure 22:
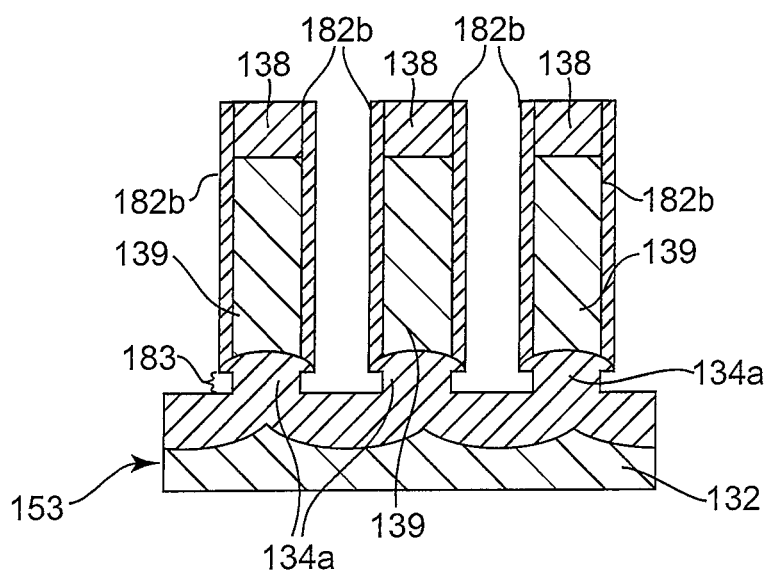
FIG. 22 illustrates a cross-sectional view of one embodiment of the etched wafer and the first protection material layer after oxidizing exposed portions of the etched wafer.

FIG. 22 illustrates a cross-sectional view of one embodiment of etched wafer 153 and first protection material layer 182b after oxidizing exposed portions 183 of silicon portions 139a and substrate 132. Exposed portions 183 of silicon portions 139a are oxidized to provide silicon portions 139 similar to silicon portions 139 previously described and illustrated with reference to FIG. 9 and first oxide layers 134a as previously described and illustrated with reference to FIG. 2. First protection material layer 182b is then removed and the fabrication process continues as previously described and illustrated beginning at FIG. 10.

The following FIGS. 23-30 illustrate another embodiment for fabricating stacked finFET SONOS memory 130 previously described and illustrated with reference to FIG. 2.

Figure 23:
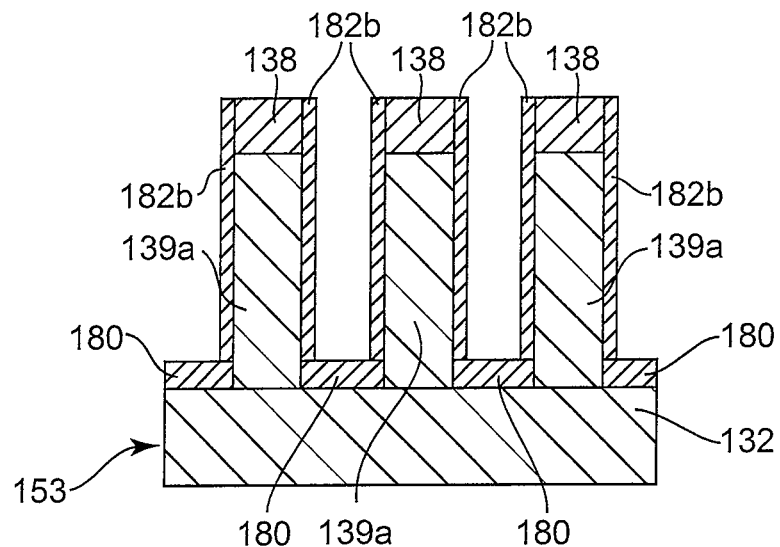
FIG. 23 illustrates a cross-sectional view of one embodiment of the etched wafer, the first spacer material layer, and the first protection material layer after etching the first protection material layer.

FIG. 23 illustrates a cross-sectional view of one embodiment of etched wafer 153, first protection material layer 182b, and first spacer material layer 180 after etching first protection material layer 182a as previously described and illustrated with reference to FIG. 21. In this embodiment, wafer 153 is processed as previously described and illustrated with reference to FIGS. 18-21, except that in this embodiment, first spacer material layer 180 is not etched.

Figure 24:
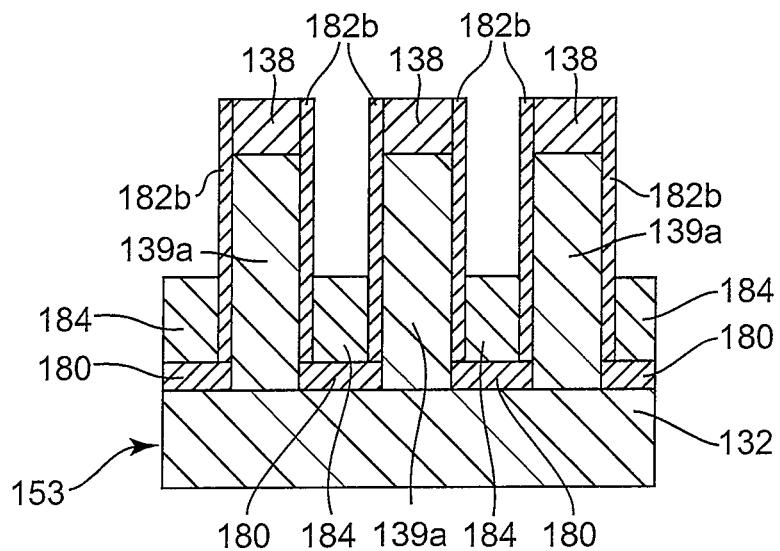
FIG. 24 illustrates a cross-sectional view of one embodiment of the etched wafer, the first spacer material layer, the first protection material layer, and a second spacer material layer.

FIG. 24 illustrates a cross-sectional view of etched wafer 153, first protection material layer 182b, first spacer material layer 180, and a second spacer material layer 184. Spacer material, such as an oxide (e.g., $SiO_2$) or other suitable spacer material is deposited over exposed portions of hard mask material layers 138, first protection material layer 182b, and first spacer material layer 180. The spacer material is deposited using CVD, ALD, MOCVD, PVD, JVD, or other suitable deposition technique. The spacer material is etched using a recess etch, back etch, or other suitable etch to provide second spacer material layer 184.

Figure 25:
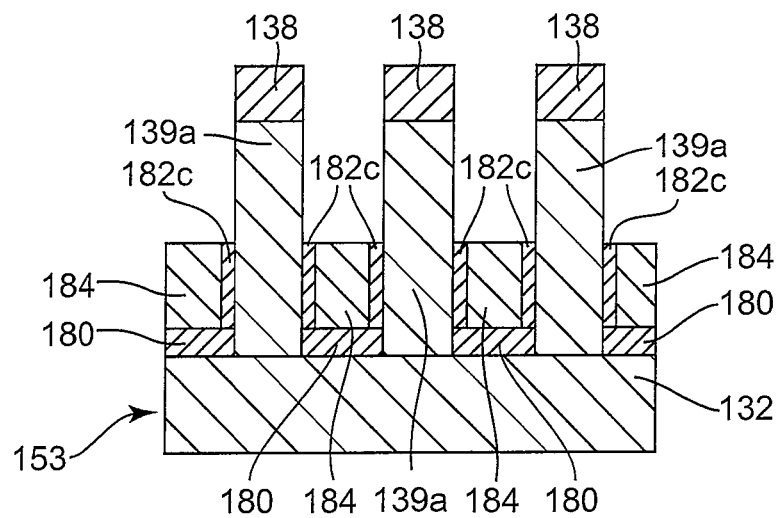
FIG. 25 illustrates a cross-sectional view of one embodiment of the etched wafer, the first and second spacer material layers, and the first protection material layer after etching the first protection material layer.

FIG. 25 illustrates a cross sectional view of one embodiment of etched wafer 153, first and second spacer material layers 180 and 184, and first protection material layer 182c after etching first protection material layer 182b. First protection material layer 182b is etched to expose portions of silicon portions 139a and to provide first protection material layer 182c.

Figure 26:
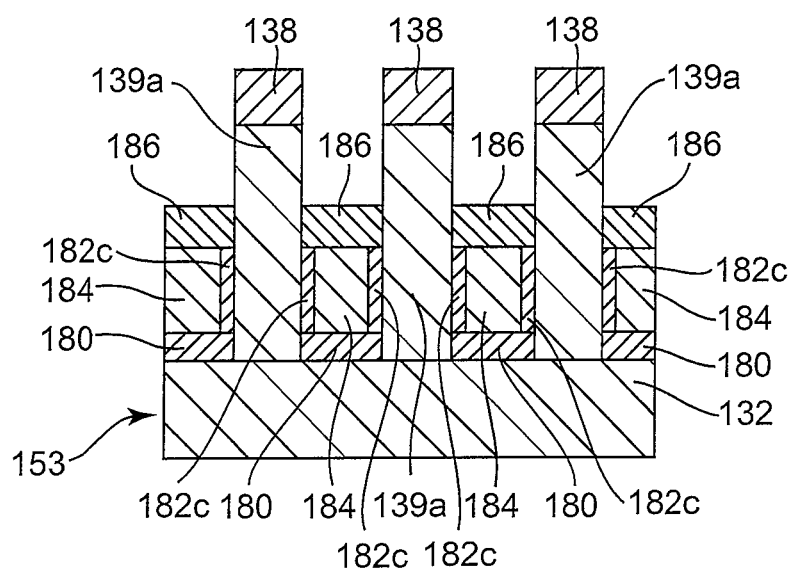
FIG. 26 illustrates a cross-sectional view of one embodiment of the etched wafer, the first and second spacer material layers, the first protection material layer, and a third spacer material layer.

FIG. 26 illustrates a cross-sectional view of one embodiment of etched wafer 153, first and second spacer material layers 180 and 184, first protection material layer 182c, and a third spacer material layer 186. Spacer material, such as an oxide (e.g., $SiO_2$) or other suitable spacer material is deposited over exposed portions of hard mask material layers 138, silicon portions 139a, first protection material layer 182c, and second spacer material layer 184. The spacer material is deposited using CVD, ALD, MOCVD, PVD, JVD, or other suitable deposition technique. The spacer material is etched using a recess etch, back etch, or other suitable etch to provide third spacer material layer 186.

Figure 27:
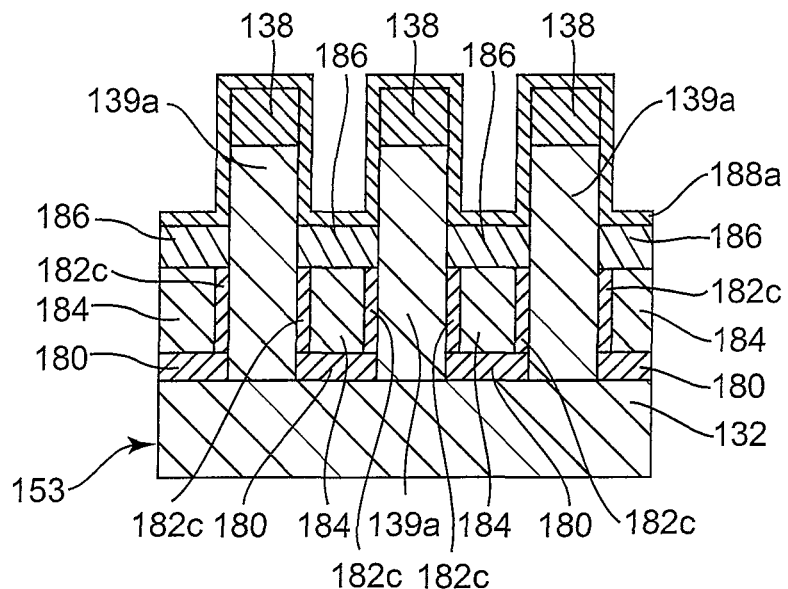
FIG. 27 illustrates a cross-sectional view of one embodiment of the etched wafer, the first, second, and third spacer material layers, the first protection material layer, and a second protection material layer.

FIG. 27 illustrates a cross-sectional view of one embodiment of etched wafer 153, first, second, and third spacer material layers 180, 184, and 186, first protection material layer 182c, and a second protection material layer 188a. A protection material, such as SiN or other suitable protection material is conformally deposited over exposed portions of hard mask material layers 138, silicon portions 139a, and third spacer material layer 186 to provide second protection material layer 188a. Second protection material layer 188a is deposited using CVD, ALD, MOCVD, PVD, JVD, or other suitable deposition technique.

Figure 28:
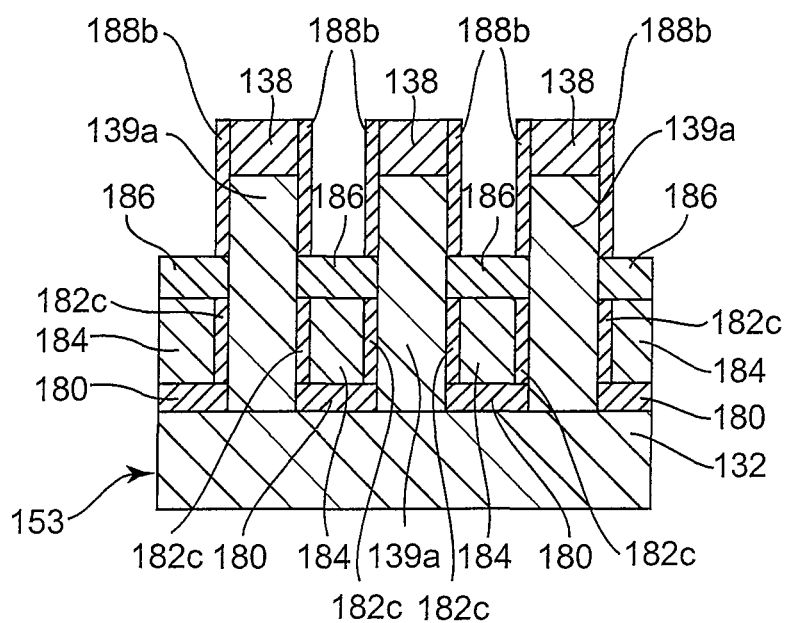
FIG. 28 illustrates a cross-sectional view of one embodiment of the etched wafer, the first, second, and third spacer material layers, the first protection material layer, and the second protection material layer after etching the second protection material layer.

FIG. 28 illustrates a cross-sectional view of one embodiment of etched wafer 153, first, second, and third spacer material layers 180, 184, and 186, first protection material layer 182c, and second protection material layer 188b after etching second protection material layer 188a. Second spacer material layer 188a is etched using a spacer reactive ion etch or other suitable etch to expose the top of hard mask 138 and the top of third spacer material layer 186 and to provide second protection material layer 188b.

Figure 29:
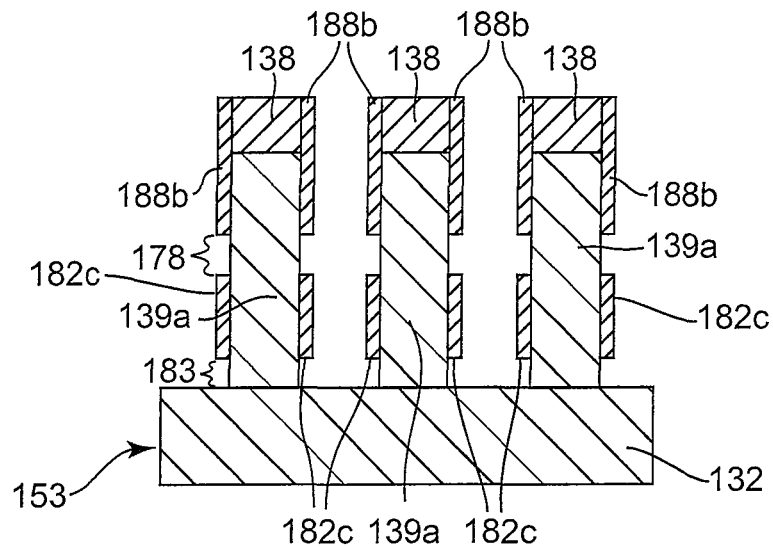
FIG. 29 illustrates a cross-sectional view of one embodiment of the etched wafer and the first and second protection material layers after etching the first, second, and third spacer material layers.

FIG. 29 illustrates a cross-sectional view of one embodiment of etched wafer 153 and first and second protection material layers 182c and 188b after etching first, second, and third spacer material layers 180, 184, and 186. First, second, and third spacer material layers 180, 184, and 186 are removed using a wet etch or other suitable etch to expose portions 178 and 183 of silicon portions 139a and substrate 132.

Figure 30:
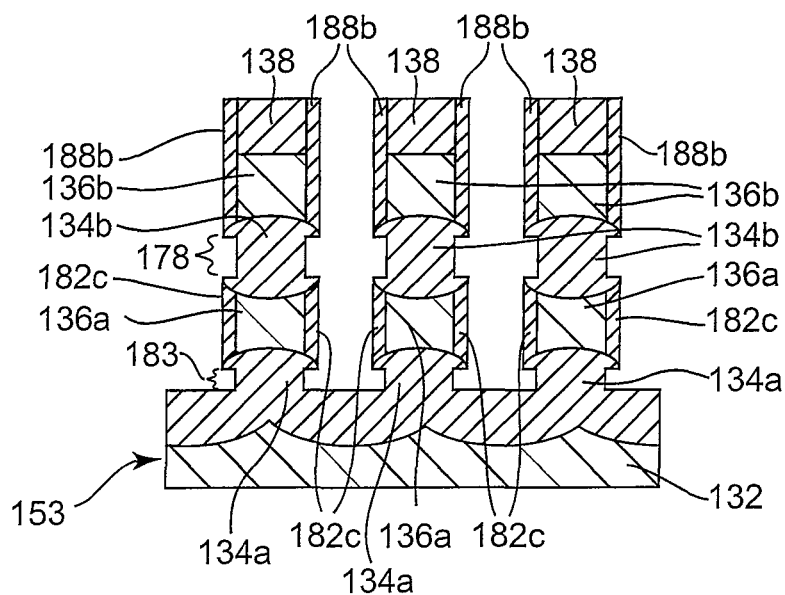
FIG. 30 illustrates a cross-sectional view of one embodiment of the etched wafer and the first and second protection material layers after oxidizing exposed portions of the etched wafer.

FIG. 30 illustrates a cross-sectional view of one embodiment of etched wafer 153 and first and second protection material layers 182c and 188b after oxidizing exposed portions 178 and 183 of silicon portions 139a and substrate 132.

Exposed portions 178 and 183 of silicon portions 139a and substrate 132 are oxidized to provide first oxide layers 134a, first bit lines 136a, second oxide layers 134b, and second bit lines 136b as previously described and illustrated with reference to FIG. 2. First and second protection material layers 182c and 188b are then removed and the fabrication process continues as previously described and illustrated beginning at FIG. 6.

Figure 31:
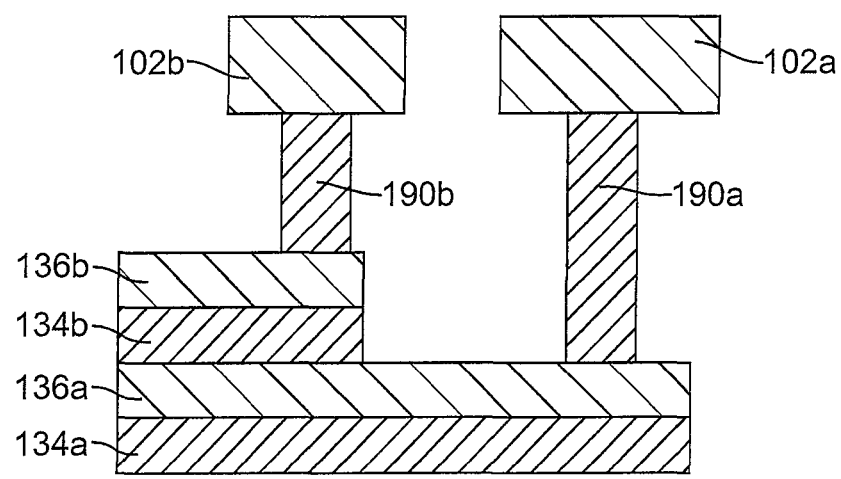
FIG. 31 illustrates a cross-sectional view of one embodiment of contacts to the upper and lower chains of memory cells within the memory array.

FIG. 31 illustrates a cross-sectional view of one embodiment of contacts 190a and 190b to a first bit line 136a and a second bit line 136b. Bit line 136a is electrically coupled to a contact 190a. Contact 190a is electrically coupled to a bit line 102a. Bit line 136b is electrically coupled to a contact 190b. Contact 190b is electrically coupled to a bit line 102b. Bit line 136a is longer than bit line 136b such that contact 190a is electrically isolated from bit line 136b and contact 190b.

Embodiments of the present invention provide a stacked finFET SONOS memory. Two or more finFET SONOS memory cells are stacked on top of each other and share a common word line. The stacked finFET SONOS memory increases the storage density of the memory while using more relaxed critical dimensions compared to typical flash memory devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a silicon substrate having a planar surface;
an oxide layer directly contacting the planar surface of the substrate and having a sidewall perpendicular to the substrate;
a first SONOS memory cell isolated from the substrate by the oxide layer;
a second SONOS memory cell, the second memory cell stacked directly on another oxide layer directly on the first memory cell such that the first memory cell is between the substrate and the second memory cell;
a hard mask material layer over the second SONOS memory cell such that the second SONOS memory cell is between the hard mask material layer and the first SONOS memory cell, the hard mask material layer having a sidewall perpendicular to the substrate; and
a word line forming a gate of the first SONOS memory cell and a gate of the second SONOS memory cell, the word line directly contacting the planar surface of the substrate and the hard mask material layer,
wherein each of the first memory cell and the second memory cell is individually accessible for read and write operations, and
wherein the first SONOS memory cell comprises a tunnel dielectric material layer that directly contacts the sidewall of the hard mask material layer, the sidewall of the oxide layer, and the planar surface of the substrate.

2. The integrated circuit of claim 1, wherein the first SONOS memory cell comprises a first finFET SONOS memory cell, and
wherein the second SONOS memory cell comprises a second finFET SONOS memory cell.

3. The integrated circuit of claim 1, wherein the integrated circuit comprises a NAND memory.

4. A memory comprising:
a silicon substrate having a planar surface;
an oxide layer directly contacting the planar surface of the substrate and having a sidewall perpendicular to the substrate;
a first memory cell comprising a first source, a first drain, a first tunnel dielectric material layer, a first trapping material layer, a first blocking dielectric material layer, and two first gates;
a second memory cell comprising a second source, a second drain, a second tunnel dielectric material layer, a second trapping material layer, a second blocking dielectric material layer, and two second gates, the second memory cell stacked directly on another oxide layer directly on the first memory cell such that the first memory cell is between the substrate and the second memory cell;
a hard mask material layer over the second memory cell such that the second memory cell is between the hard mask material layer and the first memory cell, the hard mask material layer having a sidewall perpendicular to the substrate; and
a word line coupled to the two first gates and the two second gates, the word line directly contacting the planar surface of the substrate and the hard material layer,
wherein each of the first memory cell and the second memory cell is individually accessible for read and write operations,
wherein the first source and the first drain are isolated from the substrate by the oxide layer, and
wherein the first tunnel dielectric material layer directly contacts the sidewall of the hard mask material layer, the sidewall of the oxide layer, and the planar surface of the substrate.

5. The memory of claim 4, wherein the memory comprises a NAND memory device.

6. An integrated circuit having a memory, the memory comprising:
a silicon substrate having a planar surface;
an oxide layer directly contacting the planar surface of the substrate and having a sidewall perpendicular to the substrate;
a first chain of finFET SONOS memory cells isolated from the substrate by the oxide layer;
a second chain of finFET SONOS memory cells, the second chain stacked directly on another oxide layer directly on the first chain such that the first chain is between the substrate and the second chain;
a hard mask material layer over the second chain of memory cells such that the second chain of memory cells is between the hard mask material layer and the first chain of memory cells, the hard mask material layer having a sidewall perpendicular to the substrate;
a plurality of word lines, each word line coupled to a gate of one memory cell in the first chain and a gate of one memory cell in the second chain each, word line directly contacting the planar surface of the substrate and the hard mask material layer;
a first select transistor configured to select the first chain to access a memory cell of the first chain; and
a second select transistor configured to select the second chain to access a memory cell of the second chain,
wherein each memory cell of the first chain and each memory cell of the second chain is individually accessible for read and write operations, and
wherein each memory cell of the first chain comprises a tunnel dielectric material layer that directly contacts the sidewall of the hard mask material layer, the sidewall of the oxide layer, and the planar surface of the substrate.

7. A system comprising:

a host; and a memory array communicatively coupled to the host, the memory array comprising:

a silicon substrate having a planar surface;

an oxide layer directly contacting the planar surface of the substrate and having a sidewall perpendicular to the substrate;

a first SONOS memory cell isolated from the substrate by the oxide layer;

a second SONOS memory cell, the second memory cell stacked directly on another oxide layer directly on the first memory cell such that the first memory cell is between the substrate and the second memory cell;

a hard mask material layer over the second SONOS memory cell such that the second SONOS memory cell is between the hard mask material layer and the first SONOS memory cell, the hard mask material layer having a sidewall perpendicular to the substrate; and a word line forming a gate of the first SONOS memory cell and a gate of the second SONOS memory cell, the word line directly contacting the planar surface of the substrate and the hard mask material layer, wherein each of the first memory cell and the second memory cell is individually accessible for read and write operations, and wherein the first SONOS memory cell comprises a tunnel dielectric material layer that directly contacts the sidewall of the hard mask material layer, the sidewall of the oxide layer, and the planar surface of the substrate.

8. A memory comprising:

a silicon substrate having a planar top surface;

a first oxide layer having a bottom surface, a top surface, and a sidewall extending between the bottom surface and the top surface, the bottom surface of the first oxide layer contacting the planar top surface of the substrate;

a first bit line having a bottom surface and a top surface, the first bit line doped to provide a first source region, a first drain region, and a first channel region, the bottom surface of the first bit line contacting the top surface of the first oxide layer;

a second oxide layer having a bottom surface and a top surface, the bottom surface of the second oxide layer contacting the top surface of the first bit line;

a second bit line having a bottom surface contacting the top surface of the second oxide layer, the second bit line doped to provide a second source region, a second drain region, and a second channel region, the second bit line electrically isolated from the first bit line such that the second source region, the second drain region, and the second channel region are electrically isolated from the first source region, the first drain region, and the first channel region;

a tunnel dielectric material layer contacting the sidewall of the first oxide layer, the planar top surface of the substrate, a sidewall of the first bit line, a sidewall of the second oxide layer, and a sidewall of the second bit line;

a trapping material layer contacting the tunnel dielectric material layer;

a blocking dielectric material layer contacting the trapping material layer;

a hard mask material layer having a bottom surface, a top surface, and a sidewall extending between the bottom surface and the top surface, the bottom surface of the hard mask material layer contacting a top surface of the second bit line; and a word line contacting the blocking dielectric material layer and directly contacting the planar top surface of the substrate and the top surface of the hard mask material layer, wherein the tunnel dielectric material layer contacts the sidewall of the hard mask material layer.

9. The memory of claim 8, wherein the first bit line, the tunnel dielectric material layer, the trapping material layer, the blocking dielectric material layer, and the word line provide a first SONOS memory cell;

wherein the second bit line, the tunnel dielectric material layer, the trapping material layer, the blocking dielectric material layer, and the word line provide a second SONOS memory cell, and wherein each of the first memory cell and the second memory cell is individually accessible for read and write operations.

10. The memory of claim 9, wherein the first SONOS memory cell comprises a first finFET SONOS memory cell, and wherein the second SONOS memory cell comprises a second finFET SONOS memory cell.

11. The memory of claim 8, wherein the trapping material layer comprises a nitride.

12. The memory of claim 8, wherein the blocking dielectric material layer comprises an oxide.

13. The memory of claim 8, wherein the word line comprises polysilicon.

14. The memory of claim 8, wherein the word line comprises metal.

15. The memory of claim 8, wherein the first bit line and the second bit line comprise silicon.

* * * * *